United States Patent [19]
Evans

[11] Patent Number: 5,701,261
[45] Date of Patent: Dec. 23, 1997

[54] DYNAMIC FILTER

[75] Inventor: Jonathan Paul Evans, Warley, United Kingdom

[73] Assignee: GEC Avery Limited, United Kingdom

[21] Appl. No.: 626,604

[22] Filed: Apr. 2, 1996

Related U.S. Application Data

[63] Continuation-in-part of Ser. No. 564,912, Nov. 30, 1995, abandoned, which is a continuation of Ser. No. 263,795, Jun. 22, 1994, abandoned.

[51] Int. Cl.[6] .................................................. G06F 17/10
[52] U.S. Cl. ......................................................... 364/724.01
[58] Field of Search ..................... 364/724.01, 724.19, 364/724.03, 715.06

[56] References Cited

U.S. PATENT DOCUMENTS 4,970,637  11/1990  Sato .................................. 364/724.01
5,172,334  12/1992  Hienerwadel ..................... 364/724.03

*Primary Examiner*—Tan V. Mai
*Attorney, Agent, or Firm*—Kirschstein, et al.

[57] ABSTRACT

Difficulty is experienced where filters are required to provide a high level of noise reduction and a fast step response in systems where a large input step in comparison to the final resolution may occur. A suitable filter comprises a variable length averaging filter, an averaging sample counter, the count of which is reduced by a predetermined factor when the count reaches a maximum value, and a spike counter, the count of which is incremented when the difference between an input sample and the current filter output exceeds a predetermined value, the sample count being reset to 1 when the spike count reaches a predetermined value, the filter output being otherwise maintained at the previous output.

2 Claims, 5 Drawing Sheets

Fig.4

```
DYNAMIC_FILTER (input)
{
    if(magnitude_of(input - previous_VCDF_output)>WINDOW_SIZE[averaging_length])
    {
      /* INPUT IS CHANGING */ spike_count++;

if(spike_count==MAX_STEP_DELAY)
      {
        spike_count=0;

averaging_length=1;

sum=output=input;

}
      else
      {
        output=previous_VCDF_output;
      }
    }
    else
    {
        /* INSERT INPUT VALUE INTO VCDF FILTER */ sum+= input;

sample_count++ ;

if(averaging_length == MAX_LENGTH)
      {
        averaging_length = averaging_length / REDUCTION ;

sum = sum / REDUCTION ;

}
      output = sum / averaging_length ;
    } return(output) ;
}
```

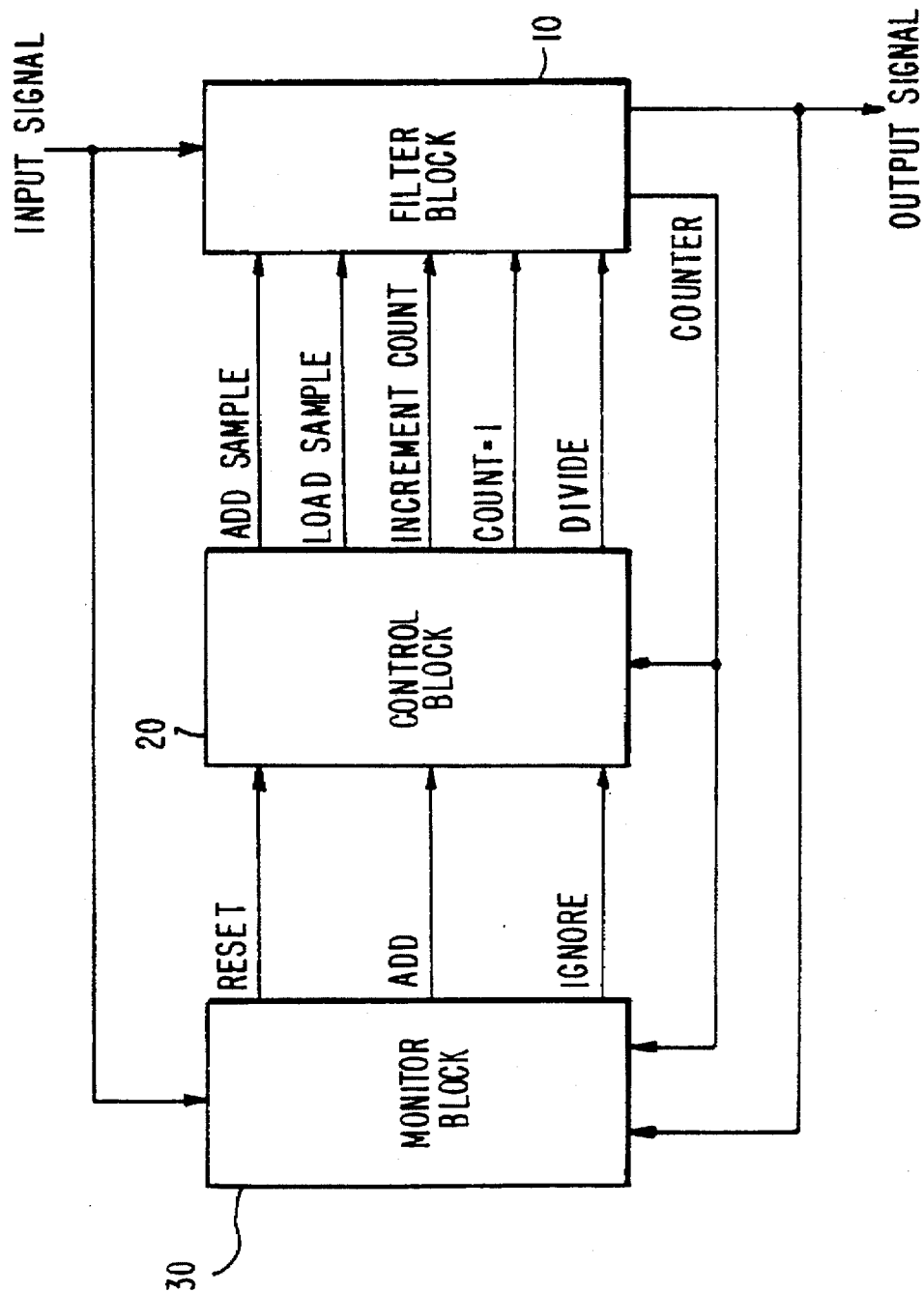

DYNAMIC FILTER

CROSS REFERENCE TO RELATED APPLICATIONS

This application is a continuation-in-part of U.S. Ser. No. 08/564,912, filed Nov. 30, 1995, now abandoned, which, in turn, is a continuation of U.S. Ser. No. 08/263,795, filed Jun. 22, 1994, now abandoned.

BACKGROUND OF THE INVENTION

The present invention relates to a filter for electrical signals which is intended to provide a high level of noise reduction in the signal while still maintaining a fast step response.

The filter has its primary application in systems which tend to experience relatively large step changes in the input signal in comparison to the final resolution of the signal required. Large in this context may be as little as 1 in 5000.

SUMMARY OF THE INVENTION

According to the present invention there is provided a filter comprising a variable length quasi-average filter, the averaging length of which is increased at each input sample and which is decreased by a predetermined factor when the averaging length reaches a maximum value, and a spike counter, the count of which is incremented when the difference between an input sample and the current filter output exceeds a predetermined value, the sample count being reset to 1 when the spike count reaches a predetermined value, the filter output being otherwise maintained at the previous output.

BRIEF DESCRIPTION OF THE DRAWINGS

The present invention will now be described, by way of example, with reference to the accompanying drawings, in which:

FIG. 4 represents an algorithm for carrying out the filter function;

FIG. 5 is a block diagram to illustrate the functioning of the filter;

DETAILED DESCRIPTION OF THE PREFERRED EMBODIMENTS

A filter according to the present invention may comprise three functional elements:

(1) A Variable Coefficient Digital Filter (VCDF);

(2) Means to detect step changes and reject spikes; and (3) Means to reduce the effects of ringing.

Figure 1:
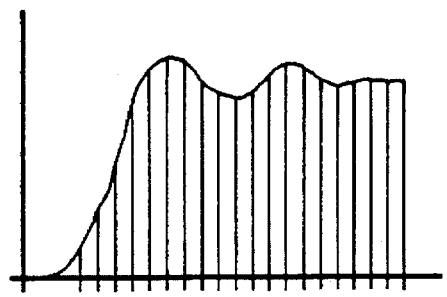
FIG. 1 shows a typical input signal divided into discrete samples.

Considering the input signal as shown in FIG. 1, the signal is sampled as indicated by the vertical lines and is then input into the VCDF. The VCDF behaves initially as a variable length averaging filter. Each time a sample is input to the filter the length of the averaging stage is incremented. When the length of the averaging stage reaches a maximum value MAX_LENGTH then the averaging length is reduced by a factor REDUCTION.

Before an input sample is presented to the input of the VCDF it is compared with the current output of the VCDF. If the difference between the input and the output exceeds a limit WINDOW_SIZE then it is assumed that either:

(a) a step change of input has occurred, or (b) an input spike has incurred.

When the limit is exceeded, a spike_count is incremented. If the spike_count reaches a value MAX_STEP_DELAY, it is assumed that a step change of input has occurred and the VCDF is reset to an average length of 1. If the count has not reached MAX_STEP_DELAY then it is assumed that a spike may be present and hence the dynamic filter outputs the previous VCDF output and the input is 'thrown away'.

If the input tends to ring after a step change, there is a risk of resetting the VCDF on each ringing cycle. This may be substantially reduced by dynamically altering the WINDOW_SIZE according to the size of the averaging stage, using a large window initially and gradually reducing the window as the length of the averaging increases.

The effect of this is shown in FIGS. 2a, 2b, 3a and 3b.

Figure 2A:
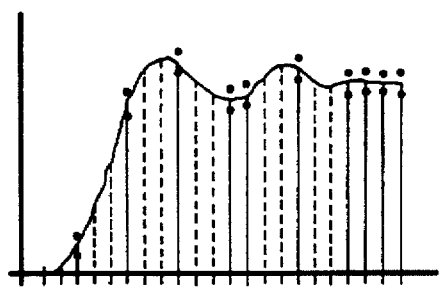
FIGS. 2a and 3a show the sampled signal of FIG. 1 at the input and output respectively of one embodiment of a filter according to this invention.
Figure 2B:
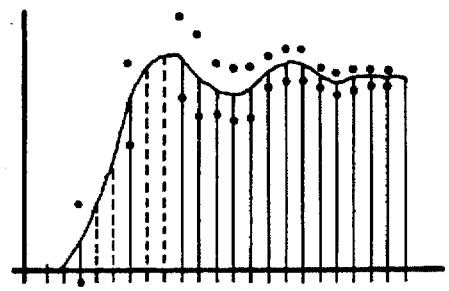
FIGS. 2b and 3b show the sampled signal of FIG. 1 at the input and output respectively of a different embodiment of a filter according to this invention.

FIGS. 2a and 2b show in the full vertical lines the samples actually presented to the VCDF. The dotted vertical lines show the samples 'thrown away' due to the 'spike account' not having reached MAX_STEP_DELAY and the change in the input having exceeded the WINDOW_SIZE. The window limits are indicated by dots above and below the input signal.

Figure 3A:
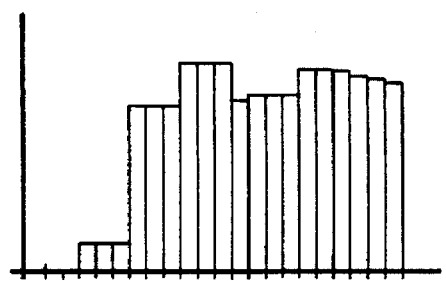
Figure 3B:
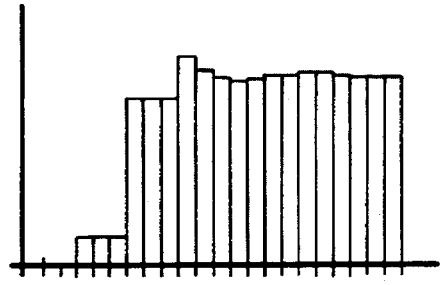

FIGS. 3A and 3B show the resulting dynamic filter outputs. FIGS. 2a and 3a are for a fixed WINDOW_SIZE and FIGS. 2b and 3b are for a variable WINDOW_SIZE.

FIG. 4 shows an algorithm for the filter operation as described where the WINDOW_SIZE is fixed.

The overall filter may be broken down into three blocks as shown in FIG. 5. The first block 10 is the filter block, a development of a running average filter and is what physically filters the input signal, referred to as the 'Filter Block'. The second block 20 is used to control what the filter does with the input signal, and is referred to as the 'Control Block'. The third block 30 determines what action needs to be taken in order to tailor the control of the filter to the signal conditions, referred to as the "Monitor Block".

The algorithm of FIG. 4 illustrates the action of these blocks as being carried out in software.

The Filter Block 10 is a development of an averaging filter.

In an averaging filter, the filter output is the sum of the previous 'n' samples divided by the number of input samples 'n', where 'n' is a fixed length, determined to suit the system involved.

For a given number of samples, an average provides the best rejection of white noise. The larger the value of 'n', the better the noise rejection. However, the larger 'n' becomes, the longer it takes for the filter to respond to a real (i.e. not noise related) change in input signal.

Figure 6:
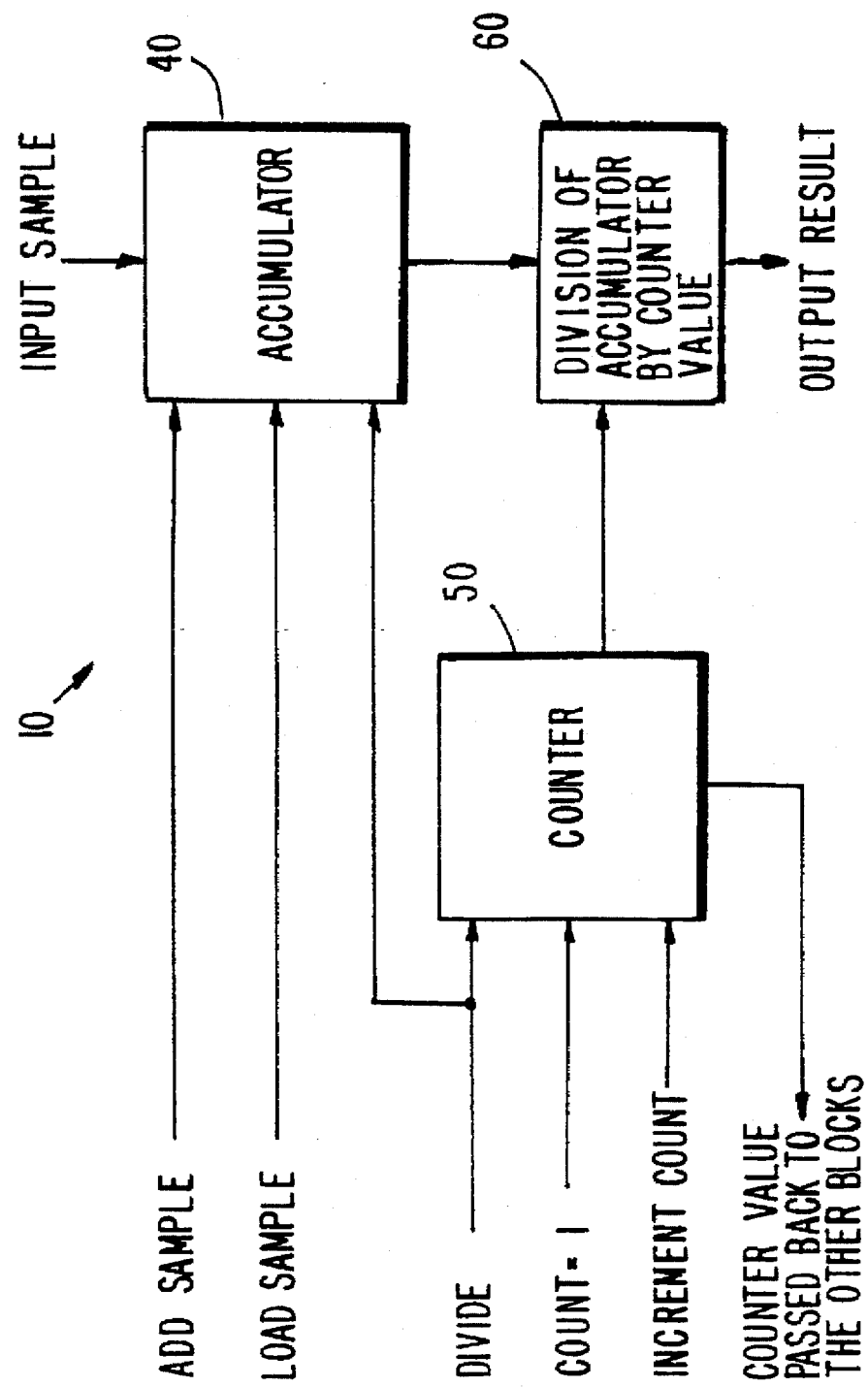
FIG. 6 shows the filter block of FIG. 5 in greater detail.
Figure 7:
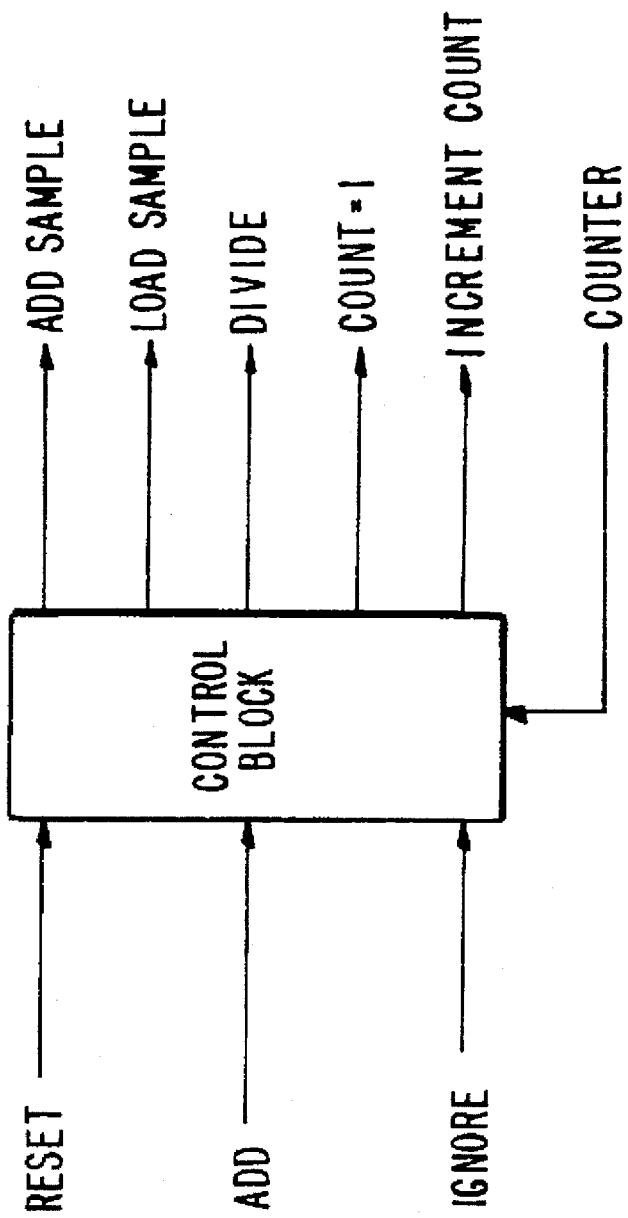
FIG. 7 shows the control block of FIG. 5 in greater detail.

In the filter block 10 shown in FIG. 6 the length of the average is made variable. Each time a new input sample becomes available, it is added into the accumulator 40 (via control 'add sample') and the counter 50 is incremented (via control 'increment count'). The output from the filter is always the accumulated sum divided at divider 60 by the sample count. The effective average_length has thus been increased, giving the best possible noise rejection for the number of samples accumulated.

At any time, the counter 50 can be reset back to a value of 1 (via the control 'count=1') and the input sample loaded directly into the accumulator 40 (via control 'load sample'. In effect, this reduces the average_length back to 1. This will be done generally as the result of the input having changed (as detected by the monitor block 30).

The basic averaging filter has been modified so that both an optimum noise reduction can be obtained and a fast response to input signals maintained. This is a simple form of variable coefficient digital filter which is a form of Finite Impulse Response filter in which all the weighting coefficients are set to 1, but the number of coefficients varies with time. Finite Impulse Response coefficient design is described in:

DIGITAL FILTERS, by R. W. Hamming, published by Prentice-Hall International, $3^{rd}$ Edition. ISBN: 0-13-212895-0.

INTRODUCTION TO DIGITAL SIGNAL PROCESSING, by Johnny R. Johnson, published by Prentice-Hall International. ISBN-0-13-480634-4.

If the input signal remains steady for a long period of time, the values held in both the counter 50 and the accumulator 40 will become very large. Thus, to avoid numerical overflow, it will be necessary to divide the accumulated sum and the count to make room for more input samples. The optimum is to simply divide both the counter and accumulator values by $^{count}/_{count-1}$ (this is exactly the same as decreasing the counter value by 1). However in practice, there is usually the restriction of only being able to divide by integers, and therefore both the counter and the accumulated sum would be divided by 2.

The Monitor Block 30 of FIG. 5 compares the input signal with the (filtered) output signal to determine the response to the input sample. There are three possible alternatives:

1) insert the input sample into the filter block 10;
2) reset the filter block 10 to become an average of 1; and
3) ignore the input sample completely.

In its simplest form, the monitor block 30 takes the difference between the filtered output signal and the output signal. It then compares this difference with a predetermined limit (referred to as window size).

If the difference is less than the window size, it is assumed that the difference is due to noise on the signal so input samples are inserted into the filter block 10.

If the difference is larger than the window size, then it is assumed that the input signal is actually changing and the filter block 10 is reset so as to become an average of 1.

The response to general input noise and input step changes have been catered for above. Another type of noise that can be present is a 'spike'. This is a transient interference signal which may be quite large but is always of short duration. An example would be a transient caused by a human body static discharge event.

When the basic monitor above detects a signal change then, instead of immediately resetting the filter, enough of the next few samples are ignored to ensure the effects of the transient have left the system.

If, after ignoring the few samples, it is found that the input signal has returned to within the window, then if it assumed that the previous change was in fact a 'spike' and filtering of the input signal is continued as normal.

However, if after ignoring the few samples it is found that the signal difference still exceeds the window size, then it is assumed that a real change in input signal has occurred and the filter block 10 is reset as for the basic monitor above.

The number of samples ignored is equal to the value MAX_STEP_DELAY above.

A further input signal characteristic is ringing which is best described by example. On a weighing machine, when a weight is suddenly placed upon it, instead of obtaining a step in the signal a step with ringing is caused, by in this case mechanical resonances. This situation is typical of many mechanical systems. The size of the ringing is generally considerably larger than the noise levels encountered.

A typical waveform is illustrated in FIG. 1. If this ringing were applied to the basic monitor block 30, then the filter block 10 would be continuously reset until the ringing had decayed. This situation is illustrated in FIG. 2a, which shows window limits as dots superimposed on the input signal waveform, and FIG. 3a which shows the resulting filter output.

However, it can be seen from FIG. 1 that if the initial step is ignored, the average of the remaining waveform is in fact correct. The basic monitor can be modified such that a very large window size is used immediately after a step change and gradually reduced with each subsequent new input sample. This is the same as making the window size a function of the value held in the filter counter 50. This is illustrated in FIG. 2b, which again shows window limits as dots superimposed on the input signal waveform and reducing with time, and FIG. 3b which shows the resulting filter output.

The Control Block 20 takes the decisions made by the monitor block 30 (RESET, ADD, or IGNORE) and the current filter count value and converts them into the necessary commands to control the filter block 10.

If a RESET is requested:

This indicates that the filter block 10 should be reset back to an average of 1. This is achieved by discarding the current accumulator value, replacing it by the new input sample (via control line 'load sample'), and setting the filter counter to 1 (via the control line 'count= 1').

If an ADD is requested:

The new sample is added to the value currently held in the accumulator 40 (via signal 'add sample') and the value of count increased (via signal 'increment count').

If the sample count has reached its maximum size MAX_LENGTH, then both the filter accumulator 40 and counter 50 are divided down by the factor REDUCTION (via signal 'divide').

If an IGNORE is requested:

The input sample is in effect thrown away, none of the filter control lines being activated.

The selection of the various filter parameters is totally dictated by the system to be filtered (i.e. the original signal source), the limitations of the system on which this filter is implemented and the maximum tolerable response time. However the following is provided as an illustration.

| | |
|---|---|
| Signal source: | A weighing system with a step response as per FIG. 1. By the way of an example it is assumed that the ringing has decayed to nothing after 50 time periods and that the biggest ring is equal to size in 5% of the final signal. |
| Measurement system: | Consider an analogue-to-digital convertor the output of which is a 20-bit number which takes three samples to stabilize due to a signal change. A 20 bit number is a number in the range 0 to 1,048,576. Sample outputs occur 50 times per second. Noise levels are of the order of 200 counts peak-to-peak. FIG. 1 is split into blocks and each block represents one measurement period. |

| | |
|---|---|
| Filter system: | Limited to integer numbers not exceeding 31 bits which equates to 2,147,483,647. This is a typical software value size often referred to as a 'long'). |
| Output response time: | Must never exceed 3 seconds. |

The filter system can handle numbers up to 2,147,483,648 which is the size of the number after adding together 2048 samples each of 1,048,575 counts. Thus, after 2048 samples, it will be necessary to divide the accumulator by 2 and the count by 2. Arithmetic restriction thus dictates that MAX SAMPLES does not exceed 2048.

It should be noted that a small but real change in input signal (i.e. one that does not get recognized by the monitor block 30 as a step change) will take 2048/50, i.e. 41 seconds to reach the output. In this case a maximum response time of 3 seconds is required which dictates that MAX_SAMPLES does not exceed 3*50, i.e. 150 samples.

Thus MAX-SAMPLES=150 (or 128, which being an integer power of 2 is very efficient to implement).

As this point it is only necessary to divide the filter block's accumulator 40 and counter 50 by $^{2048}/_{(2048-1)}$ i.e. 1.0004885, but as it is limited to integers the value of 2 must be used.

Specifically, REDUCTION=2.

Since the input noise is 200 counts peak to peak, the minimum window size should just exceed this value, i.e. be set to 201 counts.

Any spike on the original signal will affect the output of the analogue-to-digital convertor for 3 samples. Thus, MAX_STEP_DELAY must be set to a value larger than 3, so it is set to 4.

After a step change, ringing could be as much as 5% of the input signal. 5% of 1,048,575 is 52429. Thus the first window size after a step change is set to, say, 52430. After 50 time periods the tinging has ceased, so the minimum window size referred to above is used, i.e. 200 counts.

Within the first 50 time periods, the window size is gradually reduced from 52430 at sample number 1, to 200 at sample number 50. Ideally an exponential decay function should be used to determine the interim window sizes. However in practice a simple straight line decay is generally adequate.

Instead of calculating each interim value, the values can instead be calculated once (at the design stage) and stored in a look-up table. This was the method adopted in FIG. 3, where a look-up table WINDOW_SIZE was used. WINDOW_SIZE [1] in this example would be 52430 and WINDOW_SIZE [50] would be 200 (as would be WINDOW_SIZE [51] onwards).

The item averaging_length is simply the value of 'count' in the filter block 10.

I claim:

1. A filter, comprising: a variable length quasi-average filter, the averaging length of which is increased at each input sample and which is decreased by a predetermined factor when the averaging length reaches a maximum value; and a spike counter, the count of which is incremented when the difference between an input sample and the current filter output exceeds a predetermined value, the sample count being reset to 1 when the spike count reaches a predetermined value, the filter output being otherwise maintained at the previous output.

2. The filter as claimed in claim 1, wherein the predetermined value is reduced as the sample count increases.

* * * * *